(12) United States Patent
Kakimoto et al.

(10) Patent No.: US 8,895,414 B1
(45) Date of Patent: Nov. 25, 2014

(54) METHOD AND APPARATUS FOR FORMING AMORPHOUS SILICON FILM

(71) Applicant: Tokyo Electron Limited, Tokyo (JP)

(72) Inventors: Akinobu Kakimoto, Nirasaki (JP); Satoshi Takagi, Nirasaki (JP); Kazumasa Igarashi, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 14/323,148

(22) Filed: Jul. 3, 2014

Related U.S. Application Data

(62) Division of application No. 13/552,719, filed on Jul. 19, 2012, now Pat. No. 8,802,547.

(30) Foreign Application Priority Data

Jul. 22, 2011 (JP) ................................. 2011-161196

(51) Int. Cl.
*H01L 21/00* (2006.01)
*H01L 21/02* (2006.01)

(52) U.S. Cl.
CPC .... *H01L 21/02664* (2013.01); *H01L 21/02532* (2013.01); *H01L 21/02592* (2013.01); *H01L 21/0262* (2013.01)
USPC .......... 438/482; 438/483; 438/484; 438/485; 118/724; 118/725; 257/E21.09; 257/E21.091

(58) Field of Classification Search
CPC ....................................................... H01L 21/00
USPC ............ 118/724, 725; 257/E21.09, E21.091; 438/482–485
See application file for complete search history.

(56) References Cited

U.S. PATENT DOCUMENTS

| 8,431,494 B2 | 4/2013 | Murakami et al. |
| 2009/0087977 A1 | 4/2009 | Spuller et al. |
| 2011/0312192 A1 | 12/2011 | Murakami et al. |
| 2013/0005142 A1 | 1/2013 | Kakimoto et al. |

FOREIGN PATENT DOCUMENTS

| JP | 63029954 | 2/1988 |
| JP | 01217956 | 8/1989 |
| TW | 200529300 | 9/2005 |
| TW | 200901315 | 1/2009 |
| TW | 200939347 | 9/2009 |

*Primary Examiner* — Telly Green
(74) *Attorney, Agent, or Firm* — Cantor Colburn LLP

(57) ABSTRACT

A method of forming an amorphous silicon film includes: forming a seed layer on a surface of a base by heating the base and supplying an amino silane-based gas to the heated base, forming the amorphous silicon film with thickness for layer growth on the seed layer by heating the base and supplying a silane-based gas containing no amino group to the seed layer on the surface of the heated base, and decreasing a film thickness of the amorphous silicon film by etching the amorphous silicon film formed with thickness for layer growth.

8 Claims, 15 Drawing Sheets

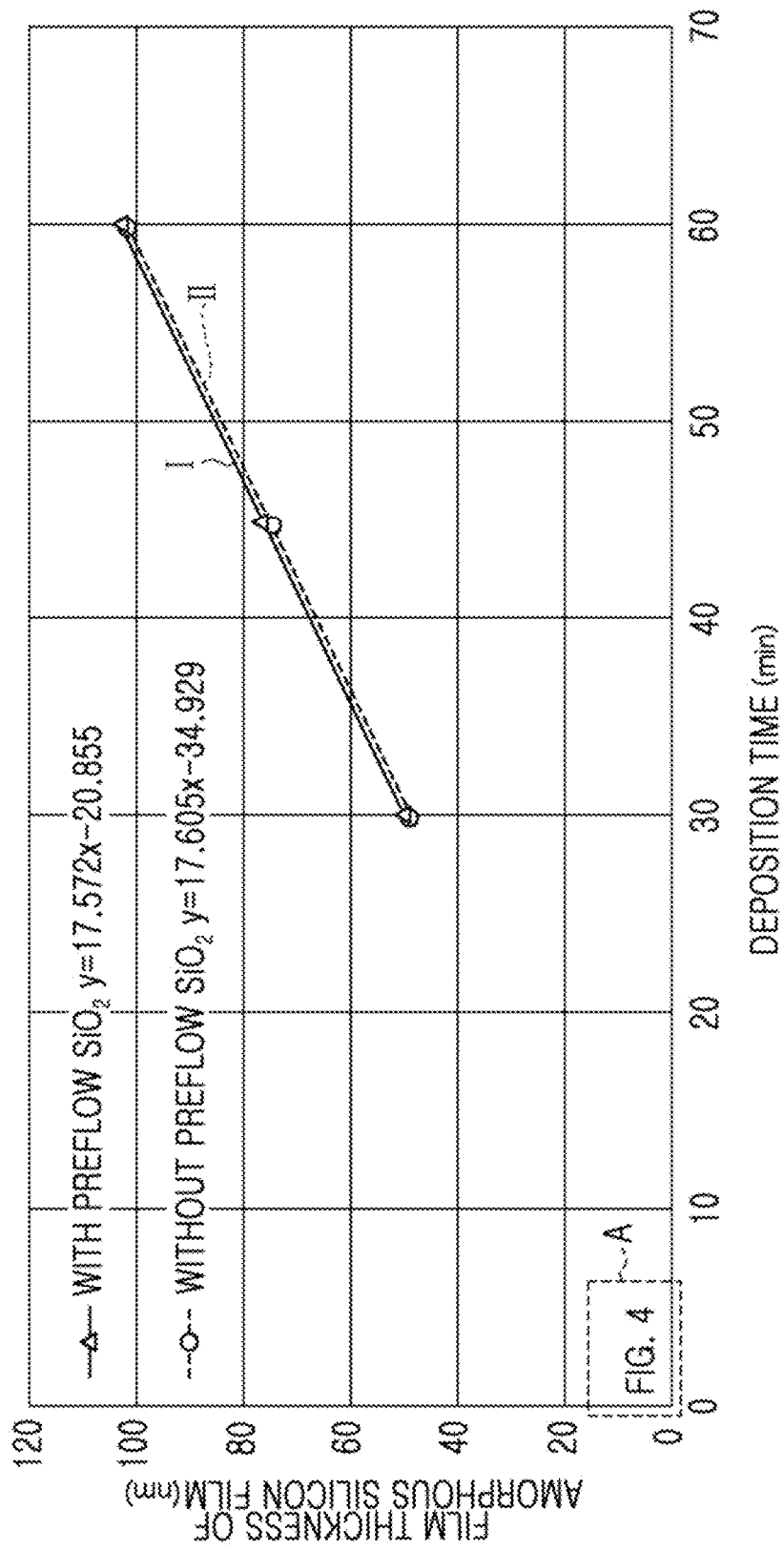

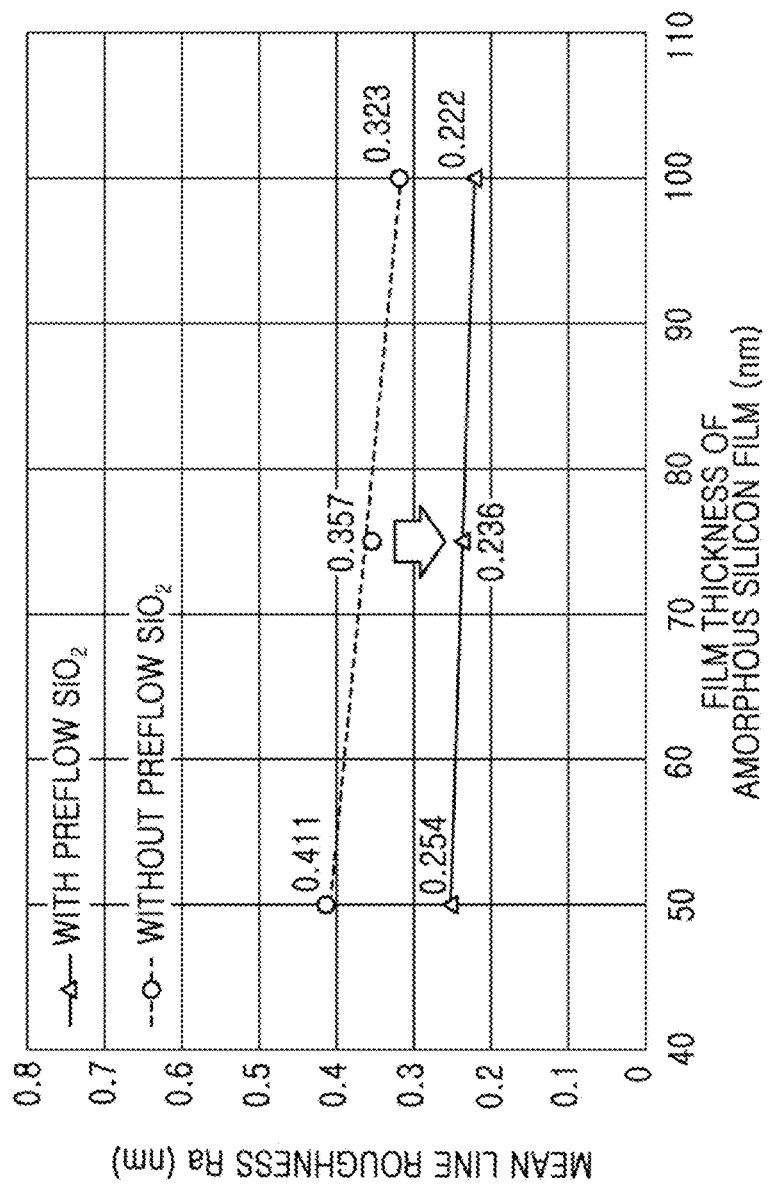

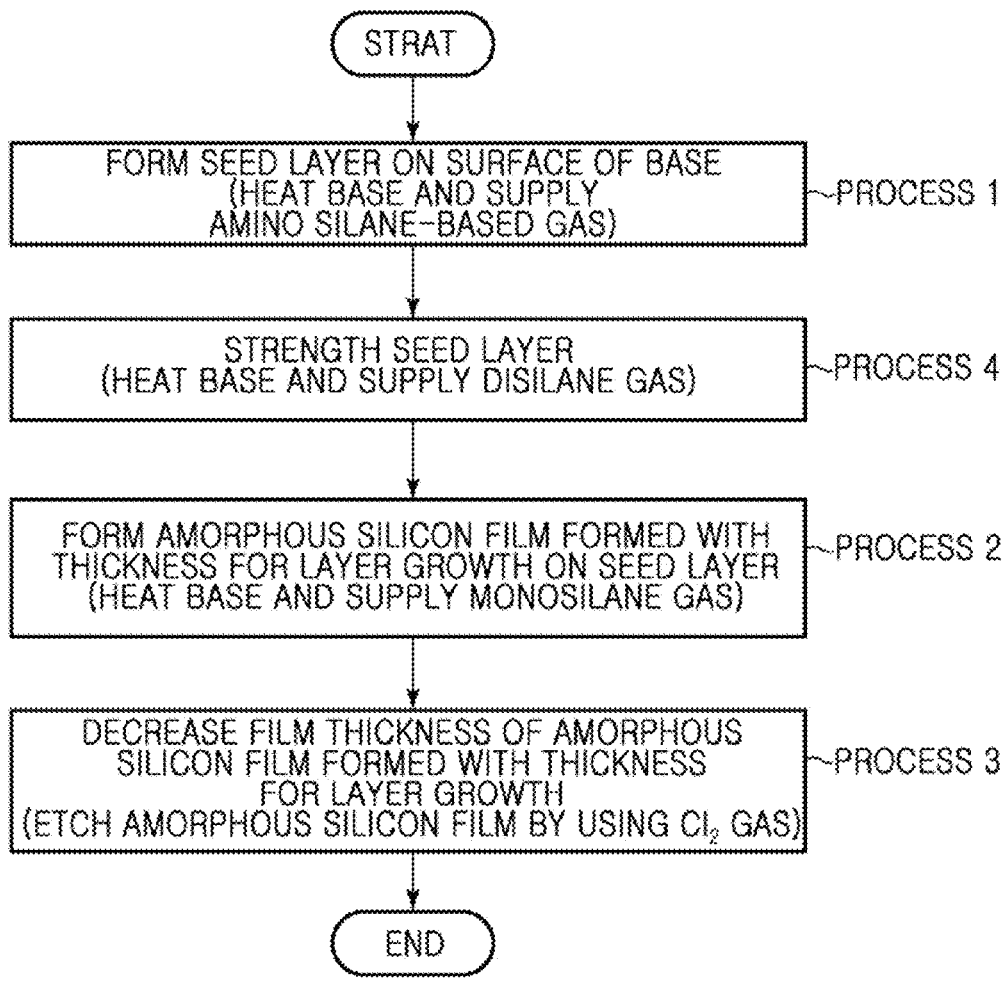

METHOD AND APPARATUS FOR FORMING AMORPHOUS SILICON FILM

CROSS-REFERENCE TO RELATED PATENT APPLICATIONS

This application is a divisional application of prior U.S. application Ser. No. 13/552,719, filed on Jul. 19, 2012, which claims the benefit of Japanese Patent Application No. 2011-161196, filed on Jul. 22, 2011, in the Japan Patent Office, the contents of which are incorporated herein in its entirety by reference.

BACKGROUND OF THE INVENTION

1. Field of the Invention

The present invention relates to a method and apparatus for forming an amorphous silicon film.

2. Description of the Related Art

An amorphous silicon film is used for embedding of a contact hole or line of a semiconductor integrated circuit apparatus, etc. A method of forming an amorphous silicon is disclosed in, for example, Patent References 1 and 2. Specifically, Patent Reference 2 discloses a method of obtaining a conductive layer having an even surface by decomposing disilane at 400 to 500° C.

Recently, accompanying high integration of a semiconductor integrated circuit apparatus is miniaturization of a contact hole or line.

In order to embed a miniaturized contact hole or line, it is essential to further thin an amorphous silicon film.

Disilane is a film-forming material that is easily thinned, but it is difficult to obtain satisfactory step coverage in an amorphous silicon film formed by using disilane. In this regard, it is easy to obtain satisfactory step coverage from silane, compared to disilane, but silane requires a long incubation time, and thus is a film-forming material that is difficult to be thinned.

Furthermore, it is important to form an amorphous silicon film having an even surface, along with a thin thickness, because if a contact hole or line is embedded with an amorphous silicon film having an uneven surface, a void may be generated.

3. Prior Art Reference (Patent Reference 1) Japanese Laid-Open Patent Publication No. sho 63-29954

(Patent Reference 2) Japanese Laid-Open Patent Publication No. hei 1-217956

SUMMARY OF THE INVENTION

The present invention provides a method and apparatus for forming an amorphous silicon film having an even surface and capable of being further thinned.

According to an aspect of the present invention, there is provided a method of forming an amorphous silicon film on a base, the method includes adsorbing an aminosilane onto the base by heating the base and supplying an amino silane-based gas to the heated base, forming the amorphous silicon film on the base onto which the aminosilane is adsorbed by heating the base and supplying a silane-based gas containing no amino group on the heated base onto which the aminosilane is adsorbed, and etching the amorphous silicon film to decrease a film thickness of the amorphous silicon film, wherein the amino silane-based gas is selected from gases comprising at least one of diisopropyl aminosilane (DIPAS), tridimethyl aminosilane (TDMAS), and bisdiethyl aminosilane (BDEAS).

According to another aspect of the present invention, there is provided an apparatus for forming an amorphous silicon film on a base, the apparatus includes a processing chamber that accommodates an object to be processed having the base where the amorphous silicon film is formed, a processing gas supply mechanism that supplies a gas used for a process into the processing chamber, a heating device that heats the object to be processed accommodated in the processing chamber, an exhauster that evacuates an inside of the processing chamber, and a controller that controls the processing gas supply mechanism, the heating device, and the exhauster, wherein the controller controls the apparatus such that the adsorbing of the aminosilane, the forming of the amorphous silicon film, and the etching of the amorphous silicon film of the method of the above aspect are sequentially performed.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a graph showing a relationship between a deposition time and a film thickness of an amorphous silicon film;

FIG. 5 is a graph showing a relationship between a film thickness of an amorphous silicon film and a mean line roughness Ra of a surface of the amorphous silicon film;

FIG. 8 is a flowchart showing an example of a sequence of an amorphous silicon film-forming method, according to another embodiment of the present invention;

DETAILED DESCRIPTION OF THE INVENTION

Figure 1:
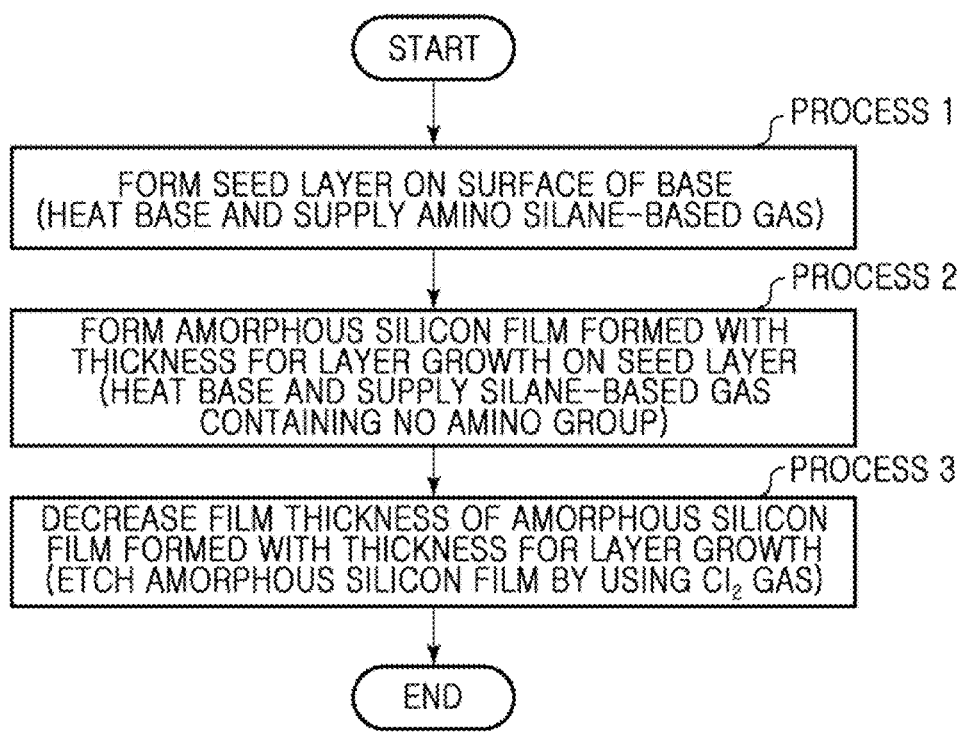
FIG. 1 is a flowchart showing an example of a sequence of an amorphous silicon film-forming method, according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

The inventors of the present application assumed that a surface roughness of an amorphous silicon film may be related to an incubation time of the amorphous silicon film. The assumption is that as the incubation time increases, a size of a nucleus easily is irregular, thereby affecting precision of a surface roughness of amorphous silicon that is deposited after generation of the nucleus.

However, a method of reducing an incubation time of an amorphous silicon film is not known.

In this regard, the inventors of the present application first succeeded in reducing an incubation time of an amorphous silicon film, and as a result, succeeded in further improving precision of a surface roughness of the amorphous silicon film.

Hereinafter, the present invention will be described in detail by explaining exemplary embodiments of the invention with reference to the attached drawings. Like reference numerals in the drawings denote like elements.

Also, in the present specification, amorphous silicon not only denotes amorphous silicon, but also includes all of amorphous silicon, nano crystalline silicon in which amorphous and nano sized crystal grains are gathered and capable of achieving precision of a surface roughness described in the present specification, and silicon in which the amorphous silicon and the nano crystalline silicon are mixed.

An Embodiment

FIG. 1 is a flowchart showing an example of a sequence of an amorphous silicon film-forming method, according to an embodiment of the present invention, and FIGS. 2A through 2E are cross-sectional views schematically showing states of a sample in the sequence of the method of FIG. 1.

Figure 2A:
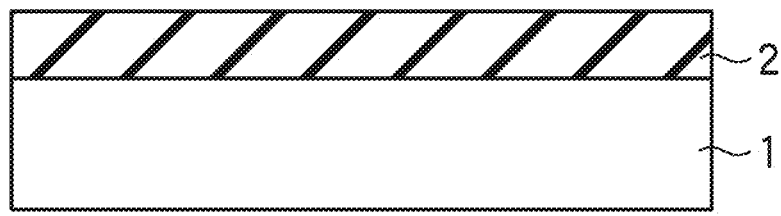
FIGS. 2A through 2E are cross-sectional views schematically showing states of a sample in the sequence of the method of FIG. 1.

First, a sample (refer to FIG. 2A) where a base 2 having a thickness of about 100 nm is formed on a semiconductor substrate shown in FIG. 2A, for example, a silicon substrate 1, is carried into a processing chamber of a film-forming apparatus. An example of the base 2 includes a silicon oxide film. However, the base 2 is not limited to a silicon oxide film, and may be a silicon nitride film or a silicon oxynitride film.

Figure 2B:
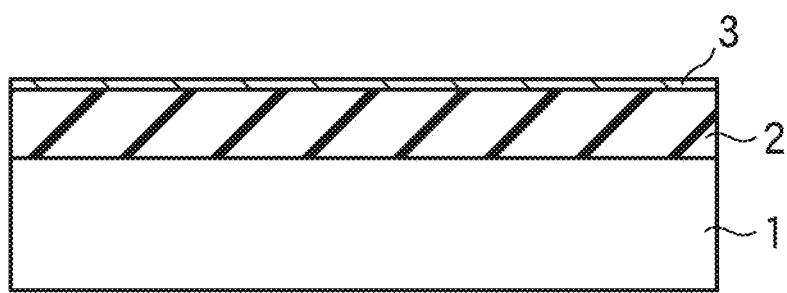

Next, as shown in FIGS. 1 and 2B, a seed layer 3 is formed on a surface of the base 2. In the present embodiment, the base 2 is heated and an amino silane-based gas is flowed on the surface of the heated base 2, thereby forming the seed layer 3 on the surface of the base 2 (process 1).

Examples of the amino silane-based gas include butyl aminosilane (BAS), bistertiary butyl aminosilane (BTBAS), dimethyl aminosilane (DMAS), bisdimethyl aminosilane (BDMAS), tridimethyl aminosilane (TDMAS), diethyl aminosilane (DEAS), bisdiethyl aminosilane (BDEAS), dipropyl aminosilane (DPAS), diisopropyl aminosilane (DIPAS), or the like. In the present embodiment, DIPAS is used.

An example of process conditions in process 1 is as follows.

DIPAS flow rate: 500 sccm
processing time: 5 minutes
processing temperature: 400° C.
processing pressure: 53.2 Pa (0.4 Torr)

Process 1 will now be referred to as preflow herein.

Figure 2C:
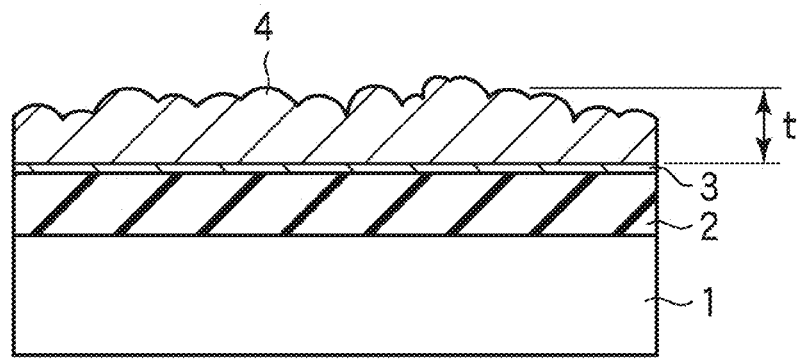
Figure 2D:
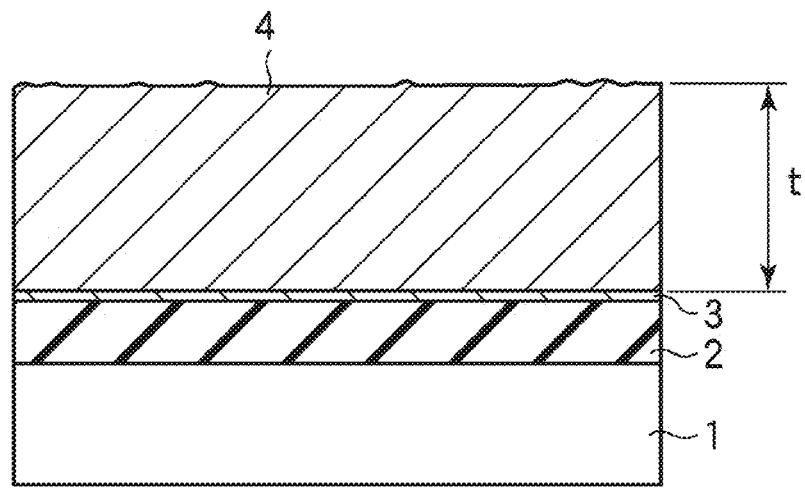

Next, as shown in FIGS. 1 and 2C through 2D, an amorphous silicon film 4 is formed on the seed layer 3.

In the present embodiment, the amorphous silicon film 4 is formed on the seed layer 3 by heating the base 2, supplying a silane-based gas containing no amino group to the seed layer 3 on the surface of the heated base 2, and thermally decomposing the silane-based gas containing no amino group (process 2).

Examples of the silane-based gas containing no amino group may include gases including at least one of $SiH_4$, $Si_2H_6$, a silicon hydride that may be expressed as $Si_mH_{2m+2}$ (where "m" is a natural number equal to or greater than 3), and a silicon hydride that may be expressed as $Si_nH_{2n}$ (wherein "n" is a natural number equal to or greater than 3). In the present embodiment, $SiH_4$ (monosilane) is used.

An example of process conditions in process 2 is as follows.

$SiH_4$ flow rate: 500 sccm
processing time: 30 minutes
processing temperature: 500° C.
processing pressure: 53.2 Pa (0.4 Torr)

Here, FIG. 3 is a graph showing a relationship between a deposition time and a film thickness of the amorphous silicon film 4. In FIG. 3, the base 2 was a silicon oxide ($SiO_2$) film. The film thickness of the amorphous silicon film 4 were measured in three cases, i.e., the case where the deposition time is 30 minutes, the case where the deposition time is 45 minutes, and the case where the deposition time is 60 minutes.

In FIG. 3, a line I indicates the case with preflow, whereas a line II indicates the case without preflow. The lines I and II are straight indicating the three measured film thicknesses that are linearly approximated by using the least squares method, and equations thereof are as follows:

$$\text{Line I: } y=17.572x-20.855 \quad (1)$$

$$\text{Line II: } y=17.605x-34.929 \quad (2)$$

As shown in FIG. 3, it is clear that, compared to the case without preflow, the thickness of the amorphous silicon film 4 tends to increase in the case with preflow.

Figure 4:
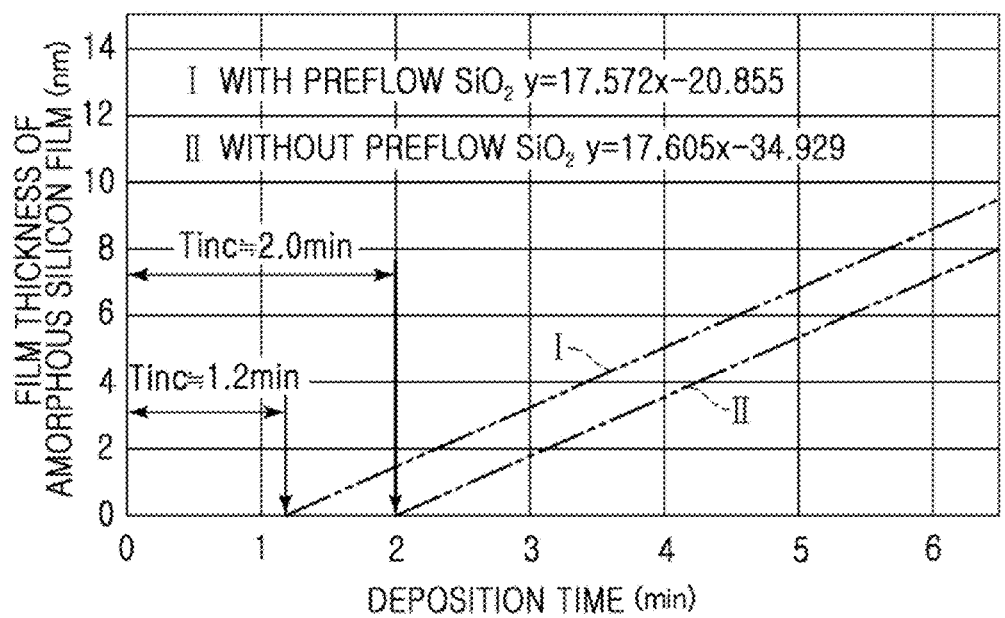
FIG. 4 is an enlarged view of the portion A of FIG. 3 indicated by broken line.

FIG. 4 shows an intersection point between the lines I and II and a deposition time in the case where a condition y=0 is given to the equations (1) and (2), that is, in the case where the thickness of an amorphous silicon film is "0". Furthermore, FIG. 4 is an enlarged view of portion A of FIG. 3 indicated by the broken line.

As shown in FIG. 4, when the base 2 is a silicon oxide film formed with preflow, deposition of the amorphous silicon film 4 begins in about 1.2 minutes (x≈1.189) after a process initiation. On the contrary, when the base 2 is a silicon oxide film formed without preflow, the deposition of the amorphous silicon film 4 begins in about 2.0 minutes (x≈1.984) after a process initiation.

FIG. 5 is a graph showing a mean line roughness (surface roughness) Ra of a surface of the amorphous silicon film 4, which is measured by using an atomic force microscope (AFM). In results shown in FIG. 5, a scan size of the AFM is set to 1 μm and a scan rate of the AFM is set to 1.993 Hz.

As shown in FIG. 5, the mean line roughness (surface roughness) Ra was improved to 0.101 nm from 0.157 nm in the case with preflow, compared to the case without preflow.

As such, by preflowing the amino silane-based gas on the base 2, the incubation time is reduced from about 2.0 minutes to about 1.2 minutes. Also, by reducing the incubation time, precision of the surface roughness of the amorphous silicon film 4 is improved, and thus the amorphous silicon film 4 having a more even surface may be obtained.

Also, during an initial film-forming process, the amorphous silicon film 4 is grown in an island shape, i.e., so-called nucleus growth occurs (FIG. 2C). When the film thickness is increased, the growth of the amorphous silicon film 4 is changed from the nucleus growth to a layer growth (FIG. 2D).

When the amorphous silicon film 4 is formed by using the monosilane on the seed layer 3, the nucleus growth occurs until a film thickness t is about 8 nm, and is changed to the layer growth when the film thickness t exceeds 8 nm. In the present embodiment, the amorphous silicon film 4 is formed with thickness for layer growth.

Figure 2E:
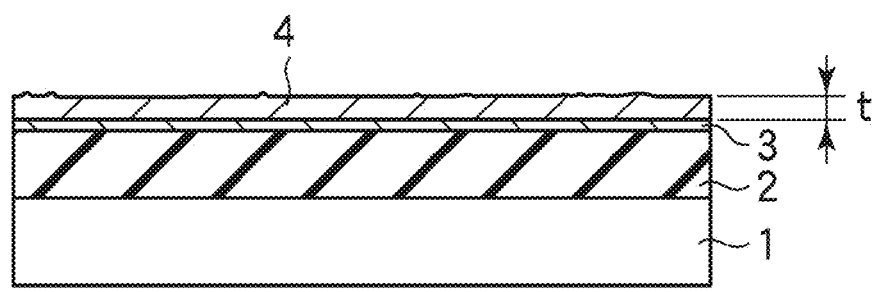

Next, as shown in FIGS. 1 and 2E, the film thickness of the amorphous silicon film 4 formed with thickness for layer growth is decreased. In the present embodiment, the amorphous silicon film 4 formed with thickness for layer growth is dry-etched, for example, for 10 minutes by using a $Cl_2$ gas. An $N_2$ gas may be simultaneously flowed as a dilution gas. Accordingly, the amorphous silicon film 4 having a thin film thickness may be obtained (process 3).

An example of process conditions of process 3 is as follows.

$Cl_2/N_2$ flow rate: 300/500 sccm
processing temperature: 300° C.
processing pressure: 39.9 to 66.5 Pa (0.3 to 0.5 Torr)
processing time: Processing time is adjusted to control the film thickness of the amorphous silicon film 4.

Figure 6A:
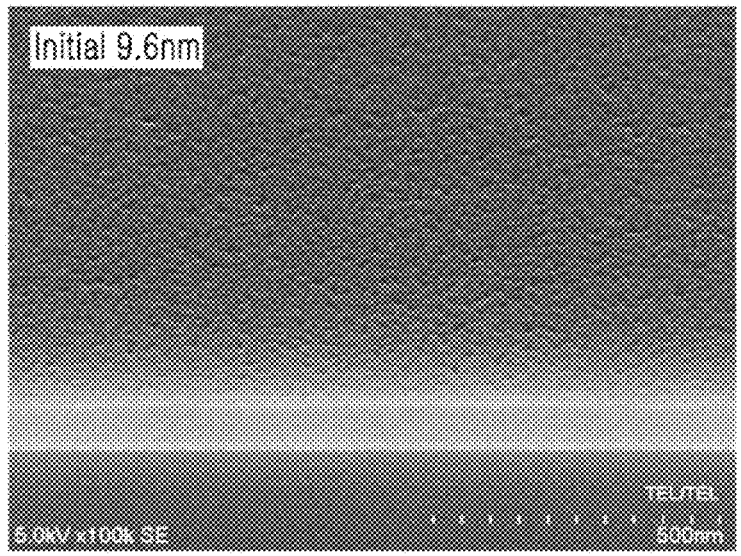
FIGS. 6A and 6B are photographs showing secondary electron images of a surface and cross-section of an amorphous silicon film.
Figure 6B:
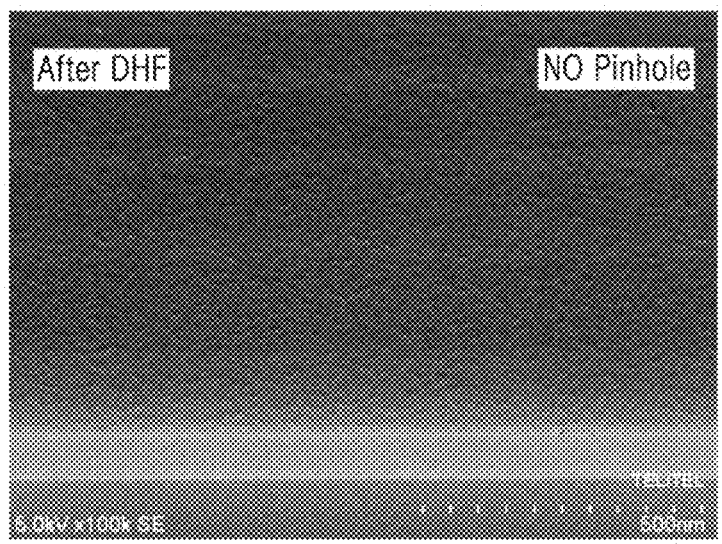

FIG. 6A is a scanning electron microscopic (SEM) image of the amorphous silicon film 4 having a film thickness of 9.6 nm after being etched by using the $Cl_2$ gas (after process 3), and FIG. 6B is an SEM image to check existence of a pinhole generated in the amorphous silicon film 4 after etching the amorphous silicon film 4 having a film thickness of 9.6 nm by using a diluted hydrofluoric acid.

Figure 7A:
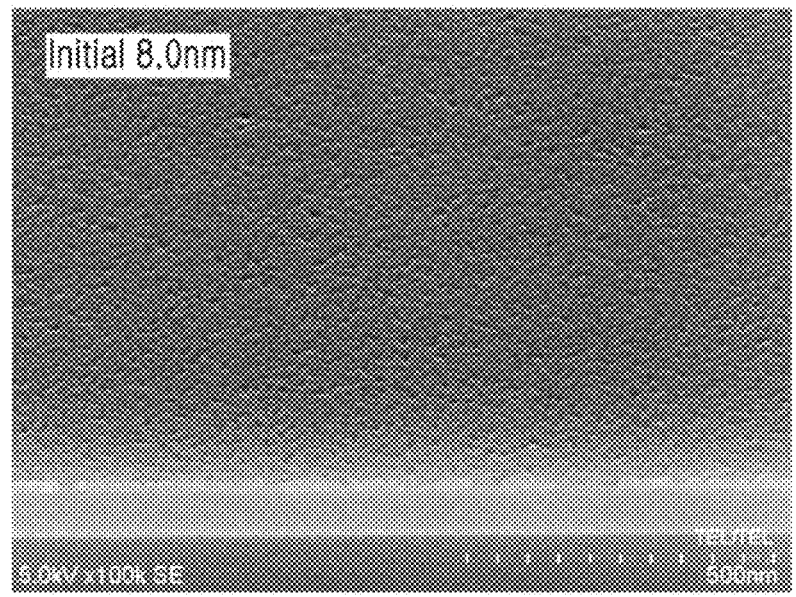
FIGS. 7A and 7B are photographs showing secondary electron images of a surface and cross-section of an amorphous silicon film.
Figure 7B:
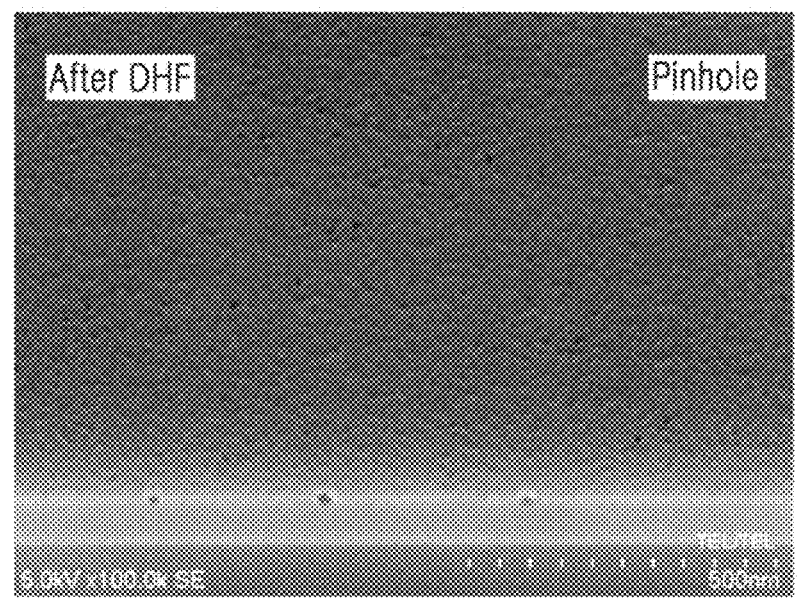

Similarly, FIG. 7A is an SEM image of the amorphous silicon film 4 having a film thickness of 8.0 nm, and FIG. 7B is an SEM image to check existence of a pinhole generated in the amorphous silicon film 4 after etching the amorphous silicon film 4 having a film thickness of 8.0 nm by using a diluted hydrofluoric acid.

As shown in FIGS. 6A through 7B, in the case where the amorphous silicon film 4 does not reach thickness for layer growth, a pinhole is generated if the amorphous silicon film 4 is etched (refer to FIG. 7B).

On the contrary, in the case where the amorphous silicon film 4 is formed with thickness for layer growth, a pinhole is not generated if the amorphous silicon film 4 is etched (FIG. 6B).

As such, by forming the amorphous silicon film 4 with thickness for layer growth and etching the amorphous silicon film 4 formed with thickness for layer growth, the amorphous silicon film 4 having a thin film thickness may be formed.

Furthermore, in the present embodiment, preflow is performed on the base 2 by using the amino silane-based gas to form the seed layer 3 before forming the amorphous silicon film 4, and thus precision of a surface roughness is improved.

Accordingly, in the present embodiment, the method of forming an amorphous silicon film having a more even surface and capable of being further thinned may be obtained.

Another Embodiment

FIG. 8 is a flowchart showing an example of a sequence of an amorphous silicon film-forming method, according to another embodiment of the present invention, and FIGS. 9A through 9F are cross-sectional views schematically showing states of a sample in the sequence of the method of FIG. 8.

As shown in FIG. 8, the method of FIG. 8 is different from the method of FIG. 1 in that the method of FIG. 8 includes a process of strengthening the seed layer 3 (process 4) between processes 1 and 2.

The seed layer 3 enables the monosilane to be easily adsorbed by uniformly generating nucleuses of silicon on a surface of a base where the amorphous silicon film 4 is formed, in the present embodiment, the base 2, for example, a silicon oxide film. In a micro point of view, the nucleuses of silicon of the seed layer 3 may be uniformly scattered in island shapes, and a flat size of the nucleuses may be very small. In this regard, when the flat size of the nucleuses is increased and an area occupied by the nucleuses on the surface of the base 2 is increased such that the island shape of the seed layer 3 infinitely approaches a single layer constituting a flat surface, or the nucleus growth of the amorphous silicon film 4 eventually approaches the layer growth by using the seed layer 3 as a single layer constituting a flat surface, it is possible to thinly form the layer grown amorphous silicon film 4 on the seed layer 3.

Figure 9A:
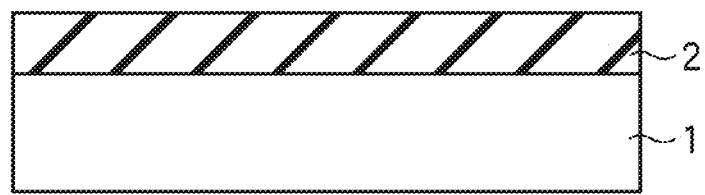
FIGS. 9A through 9F are cross-sectional views schematically showing states of a sample in the sequence of the method of FIG. 8.
Figure 9B:
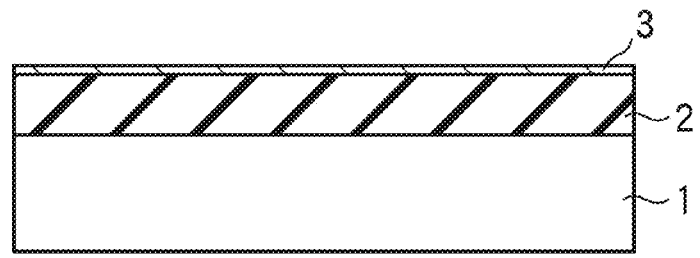
Figure 9C:
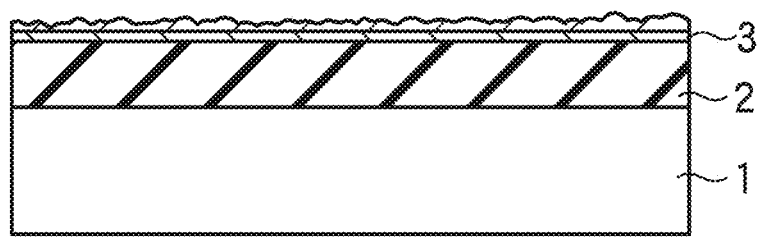

Accordingly, in the present embodiment, the seed layer 3 is strengthened before forming the amorphous silicon film 4. According to a detailed example of strengthening the seed layer 3, the flat size of the nucleuses of the silicon is increased in the seed layer 3 and the area occupied by the nucleuses on the surface of the base 2 is increased. In detail, before forming the amorphous silicon film 4 by using the monosilane, silicon is thinly adsorbed on the surface of the seed layer 3 by using silane of a higher order than the monosilane (FIG. 9C). In more detail, the base 2 on which the seed layer 3 is formed is heated, and a silane gas of a higher order than the monosilane, a disilane ($Si_2H_6$) gas in the present embodiment, is supplied.

An example of process conditions in process 4 is as follows.

Disilane flow rate: 120 sccm
processing time: 30 minutes
processing temperature: 400° C.
processing pressure: 39.9 Pa (0.3 Torr)

Figure 9D:
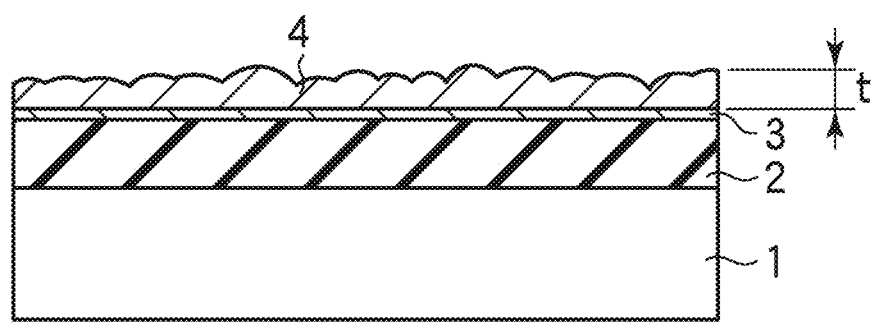
Figure 9E:
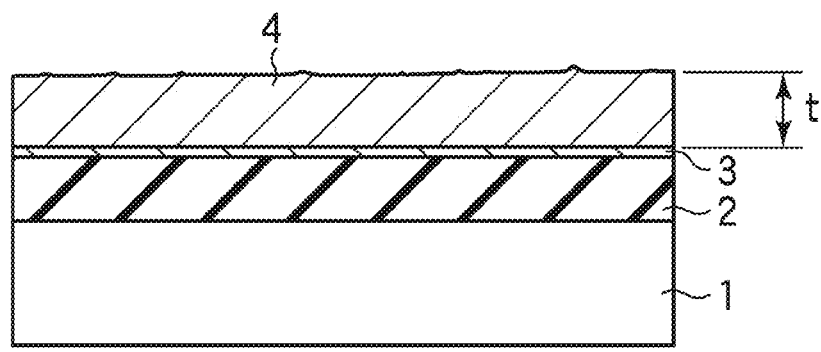
Figure 9F:
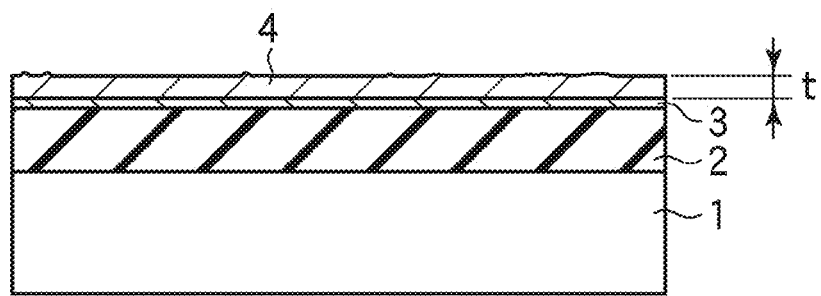

As such, the seed layer 3 is strengthened by supplying the disilane gas before supplying the monosilane, and thus the film thickness t of the layer grown amorphous silicon film 4 is further decreased as shown in FIGS. 9D and 9E.

Next, the film thickness of the layer grown amorphous silicon film 4 is decreased by etching the amorphous silicon film 4 in the same manner as in the previous embodiment.

Accordingly, the amorphous silicon film 4 may be further thinly formed in the present embodiment, like in the previous embodiment.

Figure 10A:
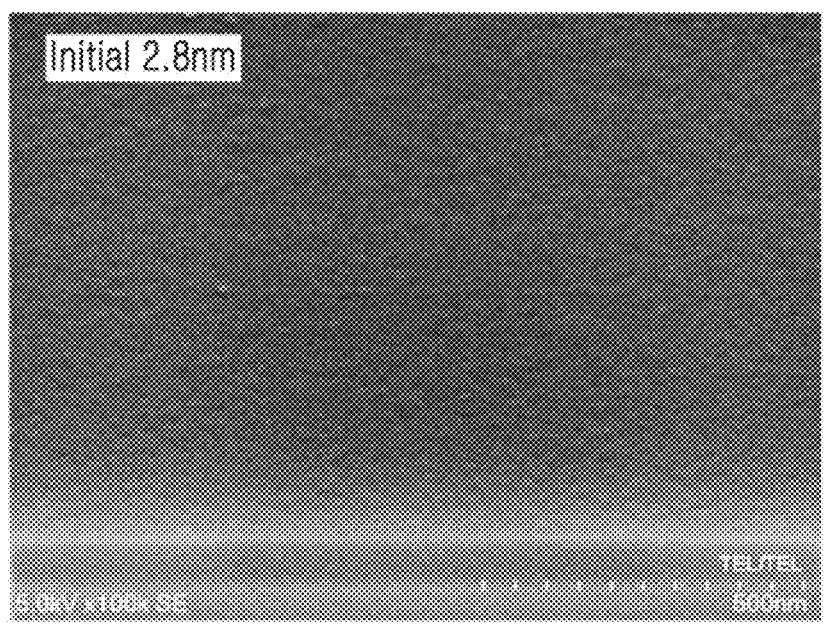
FIGS. 10A and 10B are photographs showing secondary electron images of a surface and cross-section of an amorphous silicon film.
Figure 10B:
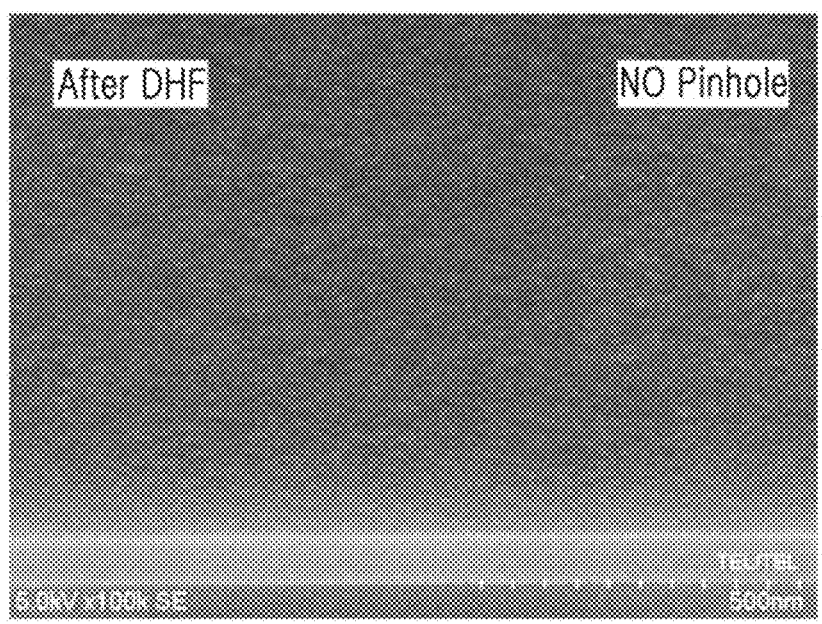

FIG. 10A is an SEM image of the amorphous silicon film 4 having a film thickness of 2.8 nm formed according to the present embodiment, and FIG. 10B is an SEM image to check existence of a pinhole generated in the amorphous silicon film 4 after etching the amorphous silicon film 4 by using a diluted hydrofluoric acid. As shown in FIG. 10B, the amorphous silicon film 4 having a film thickness of 2.8 nm according to the present embodiment does not generate a pinhole.

Accordingly, as shown in FIGS. 10A and 10B, in the present embodiment, the amorphous silicon film 4 formed with thickness for layer growth may have a thin film thickness of up to 2.8 nm.

As such, according to the present embodiment, the film thickness t of the layer grown amorphous silicon film 4 may be thinner and thus an etching time of the amorphous silicon film 4 may be reduced, compared to, for example, the previous embodiment.

Another Embodiment

Next, an example of a film-forming system capable of executing the method of forming an amorphous silicon film according to one of the above embodiments will now be described.

Figure 11:
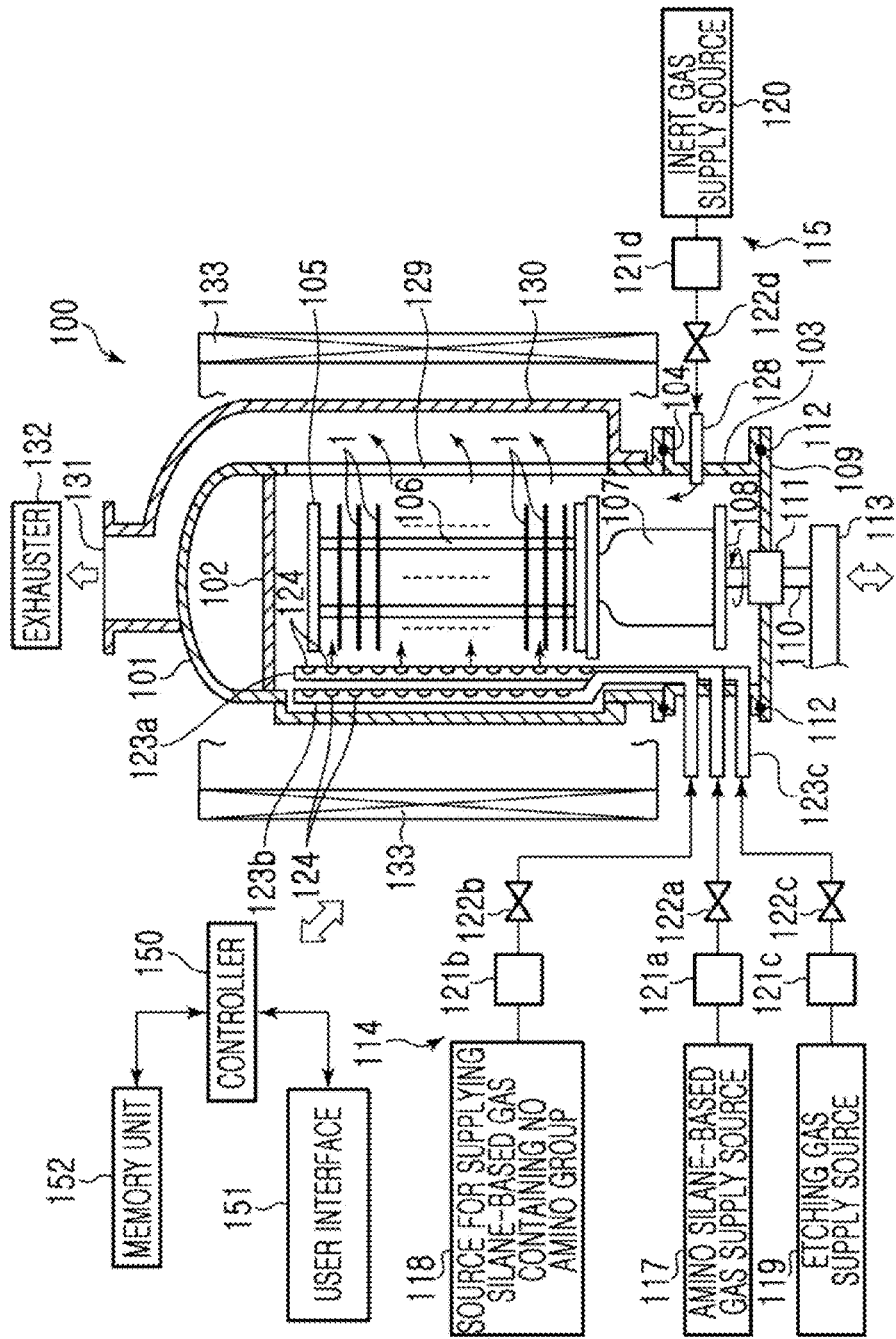
FIG. 11 is a cross-sectional view schematically showing an example of a film-forming apparatus capable of executing the methods according to the embodiments of the present invention.

FIG. 11 is a cross-sectional view schematically showing an example of a film-forming apparatus capable of executing the methods according to the above embodiments.

As shown in FIG. 11, the film-forming apparatus 100 includes a processing chamber 101 having a shape of a bottom-open cylinder with a ceiling. The entire processing chamber 101 is formed of quartz, for example. A quartz ceiling plate 102 is provided on the ceiling of the processing chamber 101. A manifold 103, which is molded of a stainless steel, for example, and has a cylindrical shape, is connected to a bottom opening of the processing chamber 101 via a sealing member 104, such as an O-ring.

The manifold 103 supports the bottom of the processing chamber 101. A quartz wafer boat 105, on which a plurality of, for example, 50 to 100, semiconductor substrates (the silicon substrates 1 in the present embodiment) as objects to be processed can be held in multiple layers, may be inserted from below the manifold 103 into the processing chamber 101. Accordingly, an object to be processed, e.g., a semiconductor substrate (the silicon substrate 1 on which a $SiO_2$ film is formed as a base in advance in the present embodiment), is accommodated in the processing chamber 101. The wafer boat 105 has a plurality of pillars 106, and a plurality of the silicon substrates 1 are supported by grooves provided on the pillars 106.

The wafer boat 105 is placed on a table 108 via a quartz thermos vessel 107. The table 108 is supported by a rotation shaft 110, which penetrates, for example, a stainless steel cover unit 109 for opening and closing the bottom opening of the manifold 103. A magnetic fluid seal 111, for example, is provided on a portion of the rotation shaft 110 penetrating the cover unit 109 so as to tightly seal the rotation shaft 110 and to rotatably support the rotation shaft 110. A sealing member 112, e.g., an O-ring, is installed between the peripheral portion of the cover unit 109 and the bottom of the manifold 103. Accordingly, sealing of the processing chamber 101 is held. The rotation shaft 110 is attached to the leading end of an arm 113 supported by an elevating mechanism (not shown), such as a boat elevator, or the like. Therefore, the wafer boat 105, the cover unit 109, and the like are elevated together and are inserted to and pulled out from the processing chamber 101.

The film-forming apparatus 100 includes a processing gas supply mechanism 114 that supplies a gas used for a process into the processing chamber 101.

The processing gas supply mechanism 114 includes an amino silane-based gas supply source 117, a source 118 for supplying a silane-based gas containing no amino group, and an etching gas supply source 119.

An inert gas supply mechanism 115 includes an inert gas supply source 120. An inert gas is used as a purge gas, or the like. An example of the inert gas includes a nitrogen ($N_2$) gas.

The amino silane-based gas supply source 117 is connected to a distribution nozzle 123a via a flow rate controller 121a and an opening/closing valve 122a. The distribution nozzle 123a is a quartz pipe and penetrates a sidewall of the manifold 103 inwardly, is bent upward and vertically extended. A plurality of gas discharge holes 124 are provided apart from each other at intervals of a predetermined distance in the vertically extending portion of the distribution nozzle 123a. The amino silane-based gas is approximately uniformly discharged toward the inside of the processing chamber 101 in a horizontal direction from each gas discharge hole 124.

The source 118 for supplying a silane-based gas containing no amino group is connected to a distribution nozzle 123b via a flow rate controller 121b and an opening/closing valve 122b. The distribution nozzle 123b is a quartz pipe and penetrates a sidewall of the manifold 103 inwardly, is bent upward and vertically extended. Like the distribution nozzle 123a, the plurality of gas discharge holes 124 are provided apart from each other at intervals of a predetermined distance in the vertically extending portion of the distribution nozzle 123b. The silane-based gas containing no amino group is approximately uniformly discharged toward the inside of the processing chamber 101 in a horizontal direction from each gas discharge hole 124.

When the method of FIG. 1 is performed, the source 118 for supplying silane-based gas containing no amino group may include, for example, only a monosilane gas supply source. On the other hand, when the method of FIG. 8 is performed, the source 118 for supplying silane-based gas containing no amino group may include, for example, a monosilane gas supply source and a disilane gas supply source.

The etching gas supply source 119 supplies an etching gas for thinning an amorphous silicon film. As described above with reference to FIGS. 1 and 8, an example of the etching gas includes a $Cl_2$ gas. Other examples of the etching gas include an $F_2$ gas and a $ClF_3$. The etching gas supply source 119 is connected to a distribution nozzle 123c via a flow rate controller 121c and an opening/shutting valve 122c. The distribution nozzle 123c is identical to the distribution nozzles 123a and 123b, and is a quartz pipe and penetrates a sidewall of the manifold 103 inwardly, is bent upward and vertically extended. Also, although not shown in FIG. 11, the plurality of gas discharge holes 124 are provided apart from each other at intervals of a predetermined distance in the vertically extending portion of the distribution nozzle 123c, like the distribution nozzles 123a and 123b. Accordingly, the etching gas is approximately uniformly discharged toward the inside of the processing chamber 101 in a horizontal direction from each gas discharge hole 124, not shown in FIG. 11.

The inert gas supply source 120 is connected to a gas introduction port 128 inwardly penetrating the sidewall of the manifold 103 via a flow rate controller 121d and an opening/closing valve 122d.

An exhaust port 129 for evacuating the inside of the processing chamber 101 is provided on a portion of the processing chamber 101, the portion opposite to the distribution nozzles 123a through 123c. The exhaust port 129 is provided to be long and narrow by vertically cutting the sidewall of the processing chamber 101. An exhaust port cover member 130 having ⊐-shaped cross-section to cover the exhaust port 129 is weld-attached to a portion of the processing chamber 101 corresponding to the exhaust port 129. The exhaust port cover member 130 is extended upward along the sidewall of the processing chamber 101, so that a gas outlet 131 is defined on the top of the processing chamber 101. An exhauster 132 including a vacuum pump or the like is connected to the gas outlet 131. The exhauster 132 evacuates the inside of the processing chamber 101 so as to exhaust a processing gas used for a process, and sets a pressure inside the processing chamber 101 to be a processing pressure according to a process.

A barrel-shaped heating device 133 is provided on an outer circumference of the processing chamber 101. The heating device 133 activates a gas supplied into the processing chamber 101 and heats objects to be processed accommodated in the processing chamber 101, for example, the semiconductor substrates (the silicon substrates 1 in the present embodiment).

A controller 150, which includes, for example, a microprocessor (computer), controls each component of the film-forming apparatus 100. A user interface 151, such as a keyboard by which an operator performs command input and the like to manage the film-forming apparatus 100, a display to visually display an operational status of the film-forming apparatus 100, or the like, is connected to the controller 150.

A memory unit 152 is connected to the controller 150. The memory unit 152 stores a control program for accomplishing various processes executed in the film-forming apparatus 100 under the control of the controller 150, or a program, that is, a recipe, for instructing each component of the film-forming apparatus 100 to execute a process according to process conditions. The recipe is stored in a storage medium in the memory unit 152, for example. The storage medium may be a hard disk or a semiconductor memory, or may be a portable type medium such as a CD-ROM, a DVD, a flash memory, or the like. Alternatively, the recipe may be suitably transmitted from another device, for example, via a dedicated line. If required, processes desired by the film-forming apparatus 100 are performed under the control of the controller 150 by invoking a recipe from the memory unit 152 according to instructions or the like from the user interface 151 and performing a process based on the recipe in the controller 150.

In the present embodiment, processes according to processes 1 through 3 of the method of FIG. 1 or processes 1, 4, 2, and 3 of the method of FIG. 8 are sequentially performed by the film-forming apparatus 100 under the control of the controller 150.

The method of FIG. 1 or 8 may be executed by using the film-forming apparatus 100 of FIG. 11.

Also, an advantage of the film-forming apparatus 100 shown in FIG. 11 is that the forming of the amorphous silicon film 4 and the $Cl_2$ etching after forming the amorphous silicon film 4 are continuously performed in the same processing chamber 101 (furnace).

For example, when the silicon substrates 1 are carried out from the processing chamber 101 after forming the amorphous silicon film 4, a silicon oxide film (natural oxide film) is formed on the surface of the amorphous silicon film 4. The $Cl_2$ gas is unable to etch the silicon oxide film. Even if the silicon oxide film is etched by the $Cl_2$ gas, the etching is performed via a pinhole of the silicon oxide film (natural oxide film), and thus the amorphous silicon film 4 is not uniformly etched.

In this regard, according to the film-forming apparatus 100 of FIG. 11, the amorphous silicon film 4 is uniformly etched without being affected by the silicon oxide film (natural oxide film) since the amorphous silicon film 4 can be continuously dry etched by the $Cl_2$ gas without carrying out the silicon substrate 1 from the processing chamber 101.

Also, according to the film-forming apparatus 100 of FIG. 11, since the forming of the seed layer 3 and the forming of the amorphous silicon film 4 are performed, precision of a surface roughness is high, and a homogeneous amorphous silicon film 4 may be obtained. Moreover, since the $Cl_2$ etching can be continuously performed on the homogeneous amorphous silicon film 4 in situ, the amorphous silicon film 4 may be obtained further thinned.

While this invention has been particularly shown and described with reference to exemplary embodiments thereof, it will be understood by those skilled in the art that various changes in form and details may be made therein without departing from the spirit and scope of the invention as defined by the appended claims.

For example, in the above embodiments, the process conditions are shown in detail, but are not limited thereto.

Improvement of a surface roughness of an amorphous silicon film, which is an advantage of the present invention, is obtained by forming the amorphous silicon film 4 by preflowing the surface of the base 2 by using the amino silane-based gas, forming the seed layer 3 on the surface of the base 2, and then supplying and thermally decomposing the silane-based gas containing no amino group on the seed layer 3.

Accordingly, the process conditions are not limited to those described above, and may vary according to a size of the silicon substrates 1, a capacity change of a processing chamber, or the like, within a range in which the advantage is not lost.

Also, a monovalent amino silane-based gas, for example, a diisopropyl amino silane (DIPAS) gas may be used as the amino silane-based gas.

Also, amino silane may be, for example, adsorbed on the base 2 instead of being decomposed. For example, DIPAS is thermally decomposed at a temperature equal to or greater than 450° C. When amino silane is thermally decomposed, impurities, such as carbon (C) and nitrogen (N), may be included in a film during formation. Thus, by adsorbing amino silane on the base 2, for example, instead of decomposing amino silane, impurities are suppressed from being included in the film during formation.

Also, in the above embodiments, the so-called higher-order silane, such as the silicon hydride that may be expressed as $Si_mH_{2m+2}$ (where, "m" is a natural number equal to or greater than 3) or the silicon hydride that may be expressed as $Si_nH_{2n}$ (where "n" is a natural number equal to or greater than 3), is used as the silane-based gas containing no amino group.

As the higher-order silane, for example, the silicon hydride that may be expressed as $Si_mH_{2m+2}$ (where "m" is a natural number equal to or greater than 3) may be selected from at least one of trisilane ($Si_3H_8$), tetrasilane ($Si_4H_{10}$), pentasilane ($Si_5H_{12}$), hexasilane ($Si_6H_{14}$), and heptasilane ($Si_7H_{16}$).

Also, for example, the silicon hydride that may be expressed as $Si_nH_{2n}$ (where "n" is a natural number equal to or greater than 3) may be selected from at least one of cyclotrisilane ($Si_3H_6$), cyclotetrasilane ($Si_4H_8$), cyclopentasilane ($Si_5H_{10}$), cyclohexasilane ($Si_6H_{12}$), and cycloheptasilane ($Si_7H_{14}$).

Also, considering a combination of the amino silane-based gas and the silane-based gas containing no amino group (silicon source), the silane-based gas containing no amino group may be monosilane ($SiH_4$) or disilane ($Si_2H_6$), which is easily thermally decomposed near a temperature where the amino silane-based gas is thermally decomposed.

Also, the methods of the above embodiments are used during manufacturing processes of a semiconductor device.

Furthermore, the present invention may be variously changed without departing from the scope of the invention.

According to the present invention, the method and apparatus for forming an amorphous silicon film having a more even surface and capable of being further thinned can be provided.

What is claimed is:
1. A method of forming an amorphous silicon film on a base, the method comprising:
adsorbing an aminosilane onto the base by heating the base and supplying an amino silane-based gas to the heated base;

forming the amorphous silicon film on the base onto which the aminosilane is adsorbed by heating the base and supplying a silane-based gas containing no amino group on the heated base onto which the aminosilane is adsorbed; and etching the amorphous silicon film to decrease a film thickness of the amorphous silicon film, wherein the amino silane-based gas is selected from gases comprising at least one of diisopropyl aminosilane (DIPAS), tridimethyl aminosilane (TDMAS), and bisdiethyl aminosilane (BDEAS).

2. The method of claim 1, further comprising, between the adsorbing of the aminosilane and the forming of the amorphous silicon film, heating the base, and supplying a silane-based gas of a higher order than the silane-based gas used during the forming of the amorphous silicon film, on the heated base onto which the aminosilane is adsorbed.

3. The method of claim 1, wherein the etching is isotropic etching.

4. The method of claim 3, wherein the isotropic etching is dry etching.

5. The method of claim 4, wherein an etchant of the dry etching comprises at least one of a chlorine ($Cl_2$) gas, a fluorine ($F_2$) gas, and a chlorine trifluoride ($ClF_3$) gas.

6. The method of claim 1, wherein the forming of the amorphous silicon film and the etching of the amorphous silicon film are continuously performed in a same processing chamber.

7. The method of claim 1, wherein the method is used during manufacturing processes of a semiconductor device.

8. An apparatus for forming an amorphous silicon film on a base, the apparatus comprising:

a processing chamber that accommodates an object to be processed having the base where the amorphous silicon film is formed;

a processing gas supply mechanism that supplies a gas used for a process into the processing chamber;

a heating device that heats the object to be processed accommodated in the processing chamber;

an exhauster that evacuates an inside of the processing chamber; and a controller that controls the processing gas supply mechanism, the heating device, and the exhauster, wherein the controller controls the apparatus such that the adsorbing of the aminosilane, the forming of the amorphous silicon film, and the etching of the amorphous silicon film of the method of claim 1 are sequentially performed.

* * * * *